(12) United States Patent
Ide et al.

(10) Patent No.: US 7,421,157 B2
(45) Date of Patent: Sep. 2, 2008

(54) OPTICAL DEMULTIPLEXING DEVICE

(75) Inventors: Akiyoshi Ide, Kasugai (JP); Yasunori Iwasaki, Nishikasugai-gun (JP); Masashi Fukuyama, Inuyama (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/683,583

(22) Filed: Mar. 8, 2007

(65) Prior Publication Data

US 2007/0160322 A1 Jul. 12, 2007

Related U.S. Application Data

(63) Continuation of application No. PCT/JP2005/018025, filed on Sep. 29, 2005.

(30) Foreign Application Priority Data

Sep. 29, 2004 (JP) ............... 2004-284360

(51) Int. Cl.
*G02B 6/26* (2006.01)
*G02B 6/28* (2006.01)

(52) U.S. Cl. ............... 385/24; 385/31; 385/47; 385/50; 385/52

(58) Field of Classification Search ............. None
See application file for complete search history.

(56) References Cited

U.S. PATENT DOCUMENTS

| 4,339,170 A | 7/1982 | Winzer |
| 6,406,196 B1 | 6/2002 | Uno et al. |
| 6,850,674 B2 | 2/2005 | Haraguchi et al. |
| 7,024,079 B2 | 4/2006 | Komiya et al. |
| 2004/0086231 A1* | 5/2004 | Fukuyama et al. ............ 385/49 |
| 2005/0117831 A1 | 6/2005 | Komiya et al. |

FOREIGN PATENT DOCUMENTS

JP 55-43599 3/1980

(Continued)

OTHER PUBLICATIONS

Kogyo Tsushin Co., Ltd., "Structure of triplexer type BI-DI", Drawing only (p. 38), OPTCOM No. 180, Mar. 2004, pp. 30-38 (and English translation of Drawing on p. 38).

(Continued)

*Primary Examiner*—Rodney Bovernick
*Assistant Examiner*—Omar Rojas
(74) *Attorney, Agent, or Firm*—Burr & Brown

(57) ABSTRACT

An optical device includes an optical fiber mount with an optical fiber disposed thereon, and an optical demultiplexer having a slit defined in the optical fiber across an optical axis thereof, and an optical demultiplexing member inserted in the slit for demultiplexing a portion of an optical signal beam transmitted through the optical fiber, wherein the optical demultiplexer guides a demultiplexed optical signal beam from the optical demultiplexing member out of the optical fiber, an optical path changer for changing an optical path of the demultiplexed optical signal beam guided out of the optical fiber, a waveguide serving as a medium from which the demultiplexed optical signal beam is emitted to the optical path changer, and a filter disposed on a surface of the waveguide.

11 Claims, 15 Drawing Sheets

FOREIGN PATENT DOCUMENTS

| | | |
|---|---|---|
| JP | 08-005862 | 1/1996 |
| JP | 2001-264594 | 9/2001 |
| JP | 2003-294990 | 10/2003 |
| JP | 2003-294992 | 10/2003 |
| JP | 2003-295000 | 10/2003 |
| WO | 03/060584 | 7/2003 |
| WO | 03/096095 | 11/2003 |
| WO | 03/098293 | 11/2003 |

OTHER PUBLICATIONS

Sato, Eisuke, et. al., "Optical Transceiver Module for Access Systems", Hitachi Communication Technologies, Ltd., OPTRONICS (2004), No. 1, pp. 172-177 (and partial English translation).

Asano, Hiroaki, et al., "Trend of PON system supporting broadband service", Panasonic Mobile Communications Co., Ltd., O plus E, Vo. 26, No. 7 issued Kabushiki Kaisha Shin-Gijutsu Communications, Jul. 2004, pp. 787-793, (and partial English translation).

* cited by examiner

OPTICAL DEMULTIPLEXING DEVICE

CROSS-REFERENCE TO RELATED APPLICATIONS

This application is based upon and claims the benefit of priority from Patent Application No. 2004-284360 filed on Sep. 29, 2004 in the Japan Patent Office, of which the contents are incorporated herein by reference.

BACKGROUND OF THE INVENTION

1. Field of the Invention

The present invention relates to an optical device suitable for use as a wavelength-multiplex optical terminal for demultiplexing a light beam in a particular wavelength range from signal light beams in various wavelength ranges (e.g., communication service signal or video signal light beams) transmitted through an optical fiber.

2. Description of the Related Art

With the recent development of wavelength-multiplex communications using a fiber amplifier, it has become customary to monitor the amounts of optical signals at respective wavelengths, adjust the amounts of optical signals, and then have an amplifier amplify the optical signals in order to maintain desired amplifier characteristics.

Various processes are known for monitoring the amounts of optical signals. According to the known processes, since monitor devices are associated with respective optical fibers, they are alone required to have a considerable size.

There have been demands for a small-size monitor device which is packaged with high density. A monitor device monitors an optical signal by extracting a portion of the optical signal. It is desirable for a monitor device to be able to monitor an optical signal without significantly attenuating the optical signal.

Heretofore, solutions to the above problems and demands have been proposed in Japanese Laid-Open Patent Publication No. 2003-294990, Japanese Laid-Open Patent Publication No. 2003-294992, Japanese Laid-Open Patent Publication No. 2003-295000, WO 03/096095 A1, WO 03/060584 A1 and WO 03/098293 A1.

According to FTTH (Fiber To The Home) services or the like, for example, since different upstream and downstream signal wavelengths are used, the subscriber needs to have a wavelength-multiplex optical terminal for processing upstream and downstream signals having different wavelengths. In the future, there will be a possibility to transmit a downstream video signal at another wavelength, and a three-wavelength wavelength-multiplex optical terminal will be required to handle all those signals.

The wavelength-multiplex optical terminal mainly comprises a WDM (Wavelength Division Multiplexing) filter, a light-detecting unit (e.g., a photodiode) for receiving a downstream signal, and a light-emitting unit (e.g., a laser diode) for transmitting an upstream signal.

For demultiplexing wavelengths with WDM filters, ordinary filters are required to have an attenuating level of about 25 dB in the cut-off range, but filters designed to meet special specifications are required to have an attenuating level of about 40 dB in the cut-off range. As shown in OPTCOM, March 2004, page 38, a bandpass filter (rejection filter) may be inserted between a WDM prism and a light-detecting unit.

Conventional wavelength-multiplex optical terminals are mainly classified into a microoptics design using a lens and a PLC design using an optical waveguide, as shown in OPTRONICS, January 2004, page 173.

Since both designs employ a light transmitting component (e.g., a lens or an optical waveguide) for guiding optical signals to a WDM filter, it is necessary to meet the most important requirement for optical components, i.e., optical alignment between the optical fiber and the light transmitting component. Accordingly, the cost of the resultant assembly tends to be high and the connection is liable to be of low reliability.

SUMMARY OF THE INVENTION

It is an object of the present invention to provide an optical device which can be used as a wavelength-multiplex optical terminal with excellent characteristics and reliability without the need for optical transmitting components such as a lens, an optical waveguide, etc.

An optical device according to the present invention comprises an optical fiber mount with an optical fiber disposed thereon, and an optical demultiplexer having a slit defined in the optical fiber across an optical axis thereof, and an optical demultiplexing member inserted in the slit for demultiplexing a portion of an optical signal beam transmitted through the optical fiber, wherein the optical demultiplexer guides a demultiplexed optical signal beam from the optical demultiplexing member out of the optical fiber, an optical path changer for changing an optical path of the demultiplexed optical signal beam guided out of the optical fiber, a waveguide serving as a medium from which the demultiplexed optical signal beam is emitted to the optical path changer, and a filter disposed on a surface of the waveguide.

According to the present invention, the optical signal beam transmitted through the optical fiber is demultiplexed by the optical demultiplexer, which has the slit defined in the optical fiber across the optical axis thereof, and the optical demultiplexing member inserted in the slit for demultiplexing a portion of the optical signal beam transmitted through the optical fiber, wherein the optical demultiplexer guides a demultiplexed optical signal beam from the optical demultiplexing member out of the optical fiber. Therefore, the optical device can be used to realize wavelength filter components, wavelength-multiplex reception devices, and transmission/reception devices without the need for lenses and optical transmission devices.

A wavelength filter component can be produced by inserting a WDM filter into the slit, and a wavelength-multiplex reception device can be produced by installing a light-detecting device for detecting the demultiplexed optical signal beam which has been guided out of the optical fiber from the optical demultiplexer.

In particular, the demultiplexed optical signal beam which has been guided out of the optical fiber has its optical path changed by the optical path changer, and thereafter is transmitted through the waveguide. By installing the light-detecting device on the optical path of the demultiplexed optical signal beam emitted from the waveguide, the demultiplexed optical signal beam applied to the light-detecting device can have its angle of incidence (the angle formed between a line normal to the light-detecting surface and the applied beam) reduced for better light-detecting characteristics.

If the filter is in the form of a bandpass filter, then the filter can provide better characteristics (a desired attenuating level in the cut-off range) when the angle of incidence of the beam on the filter is smaller. If the angle of incidence of the beam on the filter is simply to be reduced, then the optical path changer for reducing the angle of incidence needs to be provided between the optical demultiplexer and the light-detecting device, and the filter needs to be provided between the optical path changer and the light-detecting device. Therefore, the optical path from the optical demultiplexer to the light-detecting device has an increased length tending to increase the loss.

According to the present invention, at least medium from which the beam is emitted to the optical path changer comprises the waveguide, and the filter is disposed on the waveguide. Consequently, the angle of incidence of the beam on the filter is reduced, and the length of the optical path from the optical demultiplexer to the light-detecting device is prevented from being increased. Furthermore, the medium from which the beam is emitted (reflected) to the optical path changer and the medium from which the beam is applied to the filter are identical to each other. Therefore, the medium is optically uniform for better and stable characteristics.

If the waveguide serves as the medium from which the demultiplexed optical signal beam is emitted to the optical path changer and to which the demultiplexed optical signal beam is emitted from the optical path changer, then not only the beam is emitted (reflected) to the optical path changer and applied to the BPF, but also the beam is applied to the optical path changer, through the same medium, for achieving better uniformity in the optical path.

In the above arrangement, the optical demultiplexing member may comprise a wavelength demultiplexing filter, and the filter may comprise a bandpass filter for passing a light beam in a particular wavelength range of the demultiplexed optical signal beam. The filter may have an attenuating level of about 40 dB in the cut-off range, providing increased isolation between the pass range and the cut-off range.

For reducing the length of the optical path and increasing optical uniformity of the optical path of the demultiplexed optical signal beam, the waveguide may be disposed directly above the optical fiber. The length of the optical path can be reduced, and the thickness of an adhesive disposed between the optical fiber and the waveguide is also reduced. The optically unstable region (adhesive layer) is thus reduced for increased optical uniformity of the optical path of the demultiplexed optical signal beam.

Preferably, a positioning portion may be disposed on the optical fiber mount for positioning the optical path changer in an optical axis direction of the optical fiber. The optical path changer cannot be too thick in order to prevent the length of the optical path from being increased. With the optical path changer being present on a side surface, the thickness of the optical path changer cannot be greater than that is necessary to fully reflect the demultiplexed optical signal beam. If the optical path changer is not accurately positioned (longitudinally) along the optical axis of the optical fiber, the spot and the optical path changer are positionally misaligned from each other in the vertical direction, tending to cause a loss. Accordingly, the positioning portion for positioning the optical path changer along the optical axis of the optical fiber may preferably be provided on the optical fiber mount.

The optical path changer may comprise a totally reflecting mirror. The optical path changer may be directly disposed on a surface of the waveguide. A portion of the waveguide may double as the optical path changer. A light-detecting device may be disposed on the optical path of a light beam which has passed through the filter.

According to the present invention, the optical device may further comprise a light-detecting unit disposed on the optical path of a light beam which has passed through the filter, the light-detecting unit comprising a light-detecting device and a housing accommodating the light-detecting device therein, the housing having a first through hole in which the light-detecting device is accommodated and a second through hole communicating with the first through hole, wherein a light beam having passed through the filter passes through the second through hole, the second through hole having an opening width smaller than a transverse width of the light-detecting device.

If the light-detecting device is disposed over a substrate and has its light-detecting surface positioned on the optical path of the demultiplexed optical signal beam from the optical demultiplexer, then the light-detecting device may be mounted on the optical fiber mount with a spacer interposed therebetween. However, since the optical path changer and the waveguide exist on the optical fiber, if such a spacer is employed, then difficulty arises in assembling and manufacturing the optical device, making it costly to manufacture the optical device.

According to the present invention, the light-detecting device is accommodated in the first through hole defined in the housing of the light-detecting unit, and the demultiplexed optical signal beam from the optical demultiplexer passes through the second through hole which communicates with the first through hole and has the opening width smaller than the transverse width of the light-detecting device. A step disposed between the first through hole and the second through hole serves as a spacer for the light-detecting device. Since the light-detecting device can be installed in place simply by placing the housing on the optical path changer or the waveguide, the optical device can easily be assembled and manufactured at a low cost.

An optical device according to the present invention comprises an optical fiber mount with an optical fiber disposed thereon, the optical fiber having an end face, an optical demultiplexer having a slit defined in a portion of the optical fiber other than the end face across an optical axis thereof, and an optical demultiplexing member inserted in the slit for demultiplexing a portion of a first optical signal beam transmitted through the optical fiber, wherein the optical demultiplexer guides a demultiplexed optical signal beam from the optical demultiplexing member out of the optical fiber, and a holder holding a light-detecting device for detecting the demultiplexed optical signal beam from the optical demultiplexer and/or a light-emitting device for applying a second optical signal beam to the end face of the optical fiber, wherein the holder is fixed to a fixing surface of the optical fiber mount, the optical fiber being fixed in the fixing surface.

The holder which holds the light-detecting device and/or the light-emitting device can easily be fixed to the optical fiber mount. If the light-detecting device is held by the holder, then the light-detecting device can be positioned highly accurately on the optical path of the demultiplexed optical signal beam from the optical demultiplexer. If the light-emitting device is held by the holder, then the optical axis of the light-emitting device and the optical axis of the optical fiber can be positioned highly accurately with respect to each other.

In the above arrangement, the light-emitting device may be held by the holder, and the holder may have a positioning portion for determining a position where the light-emitting device is installed, the positioning portion being provided on a surface of the holder which faces the fixing surface.

The light-emitting device may comprise a CAN-type laser diode held by the holder, the CAN-type laser diode being welded to the holder. Since the CAN-type laser diode which is advantageous as to cost is used as the light-emitting device, it contributes to widespread usage of optical communications.

In the above arrangement, the light-detecting device and the light-emitting device may be held by the holder, the optical demultiplexer may demultiplex an optical signal beam in a predetermined wavelength range of the first optical signal beam transmitted through the optical fiber, and the light-detecting device may detect the demultiplexed optical signal beam in the predetermined wavelength range from the optical demultiplexer, the second optical signal beam emitted from the light-emitting device being in a wavelength range different from the wavelength range included in the first optical signal beam. It is thus possible to easily realize a wavelength-multiplex optical terminal compatible with optical communications for transmitting a video signal (downstream signal) in FTTH services or the like.

As described above, the optical device according to the present invention can be used as a wavelength-multiplex optical terminal with excellent characteristics and reliability without the need for optical transmitting components such as a lens, an optical waveguide, etc.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Embodiments of optical devices according to the present invention will be described below with reference to FIGS. 1 through 16.

Figure 1:
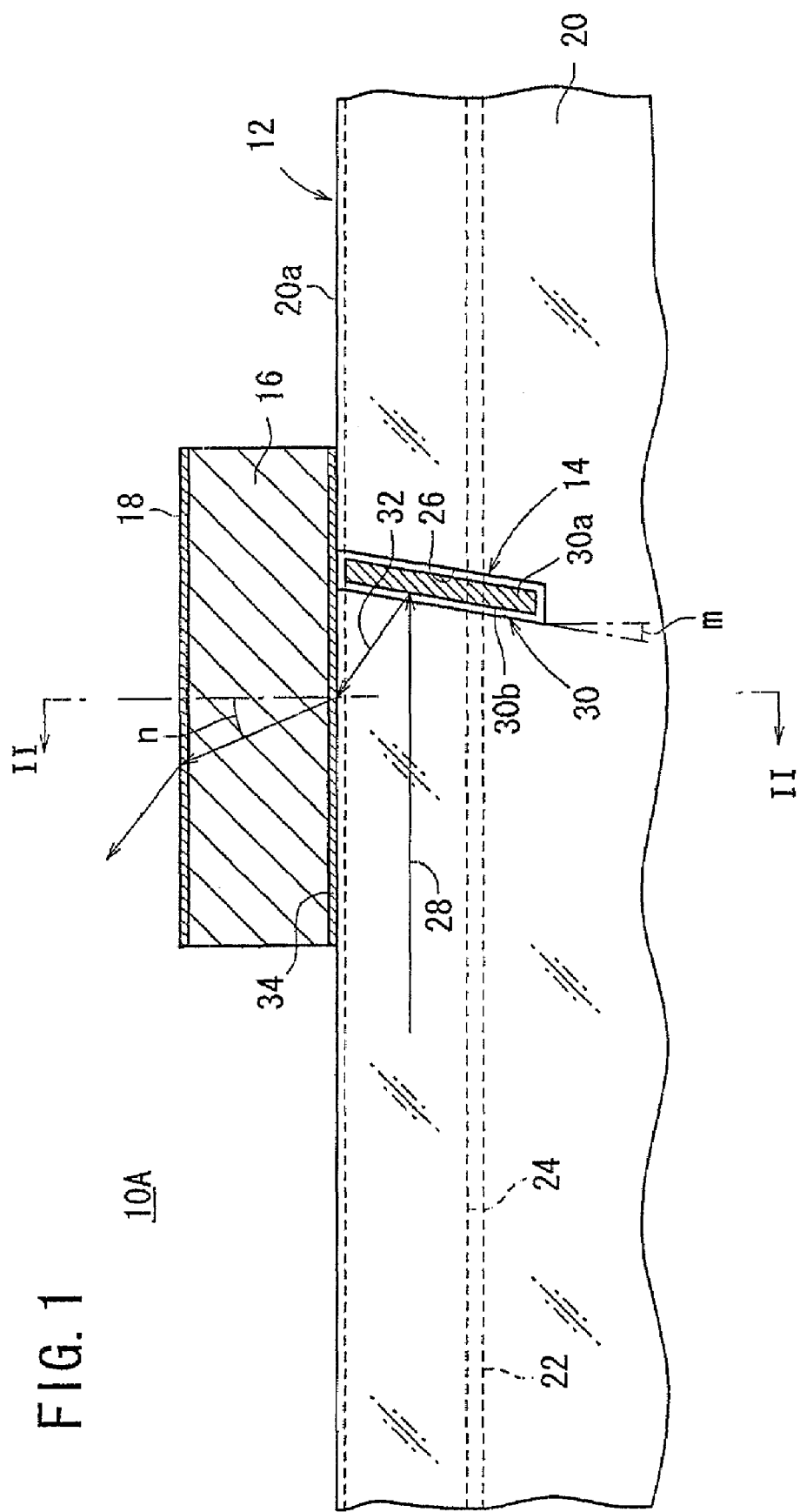
FIG. 1 is a cross-sectional view of an optical device according to a first embodiment of the present invention.
Figure 2:
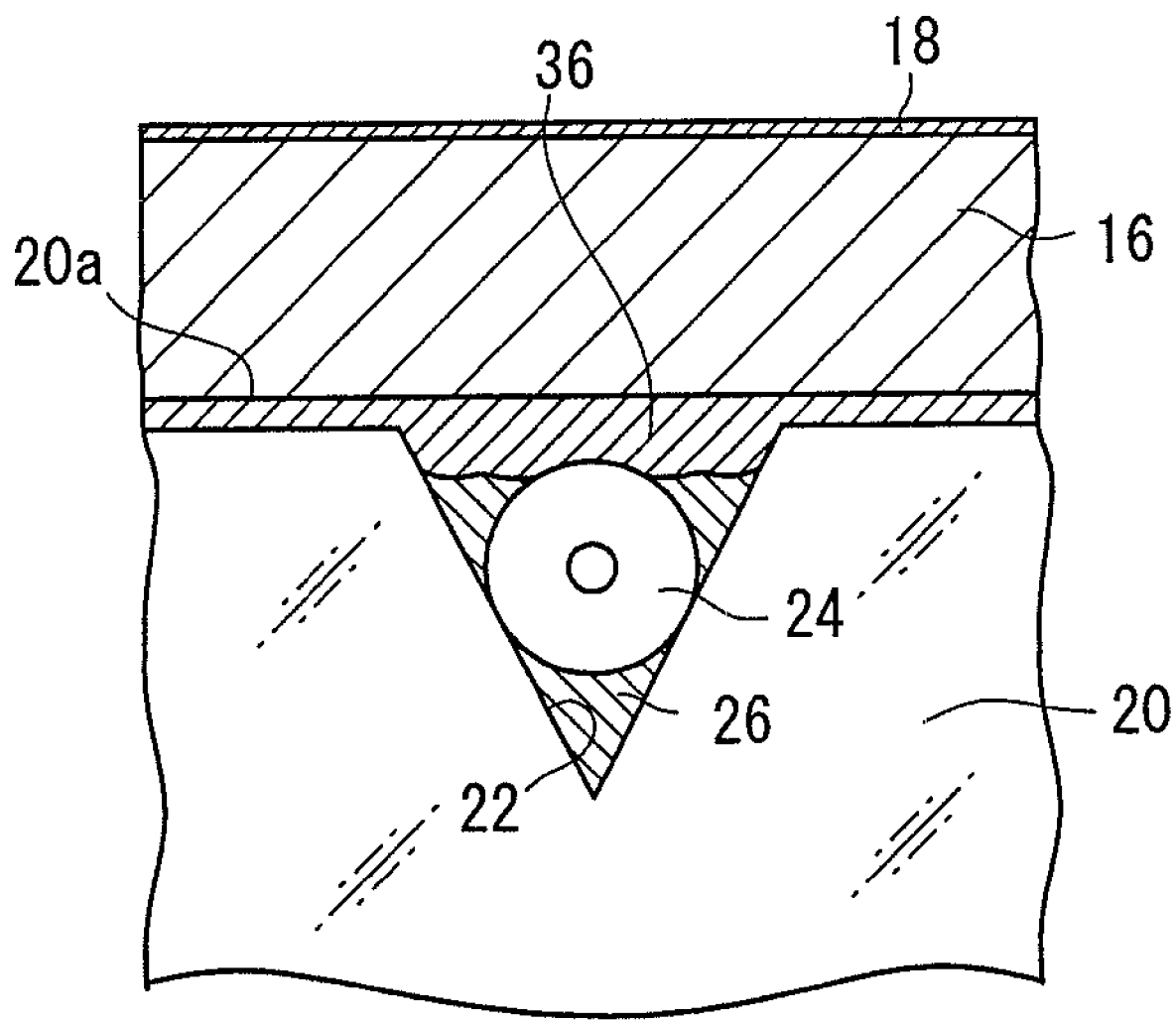
FIG. 2 is a cross-sectional view taken along line II-II of FIG. 1.

As shown in FIGS. 1 and 2, an optical device 10A according to a first embodiment of the present invention comprises an optical fiber mount 12, an optical demultiplexer 14, a waveguide 16, and a filter 18.

The optical fiber mount 12 comprises a glass substrate 20 with at least one fixing groove 22 (a V-shaped groove, a semicircular groove, or the like, see FIG. 2) defined therein. An optical fiber 24 is fixedly secured in the fixing groove 22 by a securing adhesive 25. In the present embodiment, the glass substrate 20 has a principal surface 20a positioned above the upper surface of the optical fiber 24.

The optical demultiplexer 14 has a slit 26 extending across the optical axis of the optical fiber 24, and an optical demultiplexing member 30 inserted in the slit 26 for demultiplexing a portion of an optical signal beam 28 transmitted through the optical fiber 24, as a demultiplexed optical signal beam 32. The demultiplexed optical signal beam 32 from the optical demultiplexing member 30 is guided out of the optical fiber 24. The optical demultiplexing member 30 comprises a multilayer film 30b disposed on the surface of quartz glass 30a.

The slit 26 extends from the principal surface 20a of the glass substrate 20 across the optical axis of the optical fiber 24 and has its lower end positioned below the bottom of the fixing groove 22. The slit 26 should preferably have a width ranging from 5 μm to 50 μm. If the width of the slit 26 is smaller than 5 μm, then the optical demultiplexing member 30 is so thin that it is difficult to mount the optical demultiplexing member 30 in place. If the width of the slit 26 is greater than 50 μm, then the optical demultiplexing member 30 causes too large an excess loss and does not lend itself to actual specifications. The depth of the slit 26 should preferably be in the range from 130 μm to 250 μm. If the depth of the slit 26 is smaller than 130 μm, then the fixing groove 22 may possibly terminate somewhere in the optical fiber 24 while it is being formed, and may possibly tend to serve as a starting point to start causing damage to the optical fiber 24. If the depth of the slit 26 is greater than 250 μm, it may possibly invite a reduction in the mechanical strength of the glass substrate 20. A refractive index matching agent is placed between inner wall surfaces of the slit 26 and the optical demultiplexing member 30. In the first embodiment, the slit 26 has a width of 30 μm and is inclined (to a line normal to the optical axis of the optical fiber 24) by an angle m of 20°. The line normal to the optical axis of the optical fiber 24 will be referred to as a perpendicular line.

The waveguide 16 has an optical path changer 34 for changing the optical path of the demultiplexed optical signal beam 32 that has been guided out of the optical fiber 24. The waveguide 16 guides the demultiplexed optical signal beam 32 emitted from the optical path changer 34 out of the waveguide 16. The waveguide 16 has a refractive index greater than the refractive index of the cladding layer of the optical fiber 24. The optical path changer 34 is disposed on the lower surface of the waveguide 16. Specifically, part of the waveguide 16 doubles as the optical path changer 34. The waveguide 16 is made of Si.

The waveguide 16 is disposed above the optical fiber 24 on the optical path of the demultiplexed optical signal beam 32 from the optical demultiplexer 14. In the first embodiment, the waveguide 16 is disposed on the upper surface of the glass substrate 20 and on the optical path of the demultiplexed optical signal beam 32 from the optical demultiplexer 14. As shown in FIG. 2, an adhesive 36 is applied between the waveguide 16 and the optical fiber 24 for the purpose of securing the waveguide 16. The adhesive 36 should preferably have a refractive index which is essentially the same as the refractive index of the cladding layer of the optical fiber 24.

As shown in FIG. 1, the optical demultiplexing member 30 inserted in the slit 26 comprises a wavelength demultiplexing filter (WDM filter) for demultiplexing an optical signal beam component in a certain wavelength range from the optical signal beam 28 transmitted through the optical fiber 24.

The filter 18 is in the form of a thin film disposed on the surface of the waveguide 16 and comprises a bandpass filter (BPF) for passing an optical signal beam in a particular wavelength range of the demultiplexed optical signal beam 32 from the optical demultiplexer 14. The BPF 18 has an attenuating level of about 40 dB in the cut-off range for the demultiplexed optical signal beam 32 from the optical demultiplexer 14, providing increased isolation between the pass range and the cut-off range.

Operation of the optical device 10A according to the first embodiment will be described below. An optical signal beam component in a particular wavelength range of the optical signal beam 28 transmitted through the optical fiber 24 is demultiplexed by the optical demultiplexer 14, and guided as the demultiplexed optical signal beam 32 out of the optical fiber 24. Other optical signal beam components are transmitted as the optical signal beam 28 through the optical fiber 24.

The demultiplexed optical signal beam 32 that is guided out of the optical fiber 24 enters the waveguide 16 through the adhesive 36. At this time, because of the difference between the refractive index of the cladding layer of the optical fiber 24 (or the adhesive) and the refractive index of the waveguide 16, the optical path of the demultiplexed optical signal beam 32 is changed by the lower surface of the waveguide 16, i.e., the optical path changer 34. The optical path is changed in a direction to reduce the angle n between the optical path and the perpendicular line.

The demultiplexed optical signal beam 32 whose optical path has been changed travels through the waveguide 16, and passes through the filter 18 disposed on the surface of the waveguide 16. Since the demultiplexed optical signal beam 32 is attenuated about 40 dB in the cut-off range by the filter 18, the demultiplexed optical signal beam 32 that has passed through the filter 18 is characterized by increased isolation between the pass range and the cut-off range.

The optical device 10A according to the first embodiment can be used to realize wavelength filter components, wavelength-multiplex reception devices, and transmission/reception devices without the need for lenses and optical transmission devices.

A wavelength filter component can be produced by inserting the wavelength demultiplexing filter into the slit 26, and a wavelength-multiplex reception device can be produced by installing the light-detecting unit (not shown) for detecting the demultiplexed optical signal beam 32 which has been guided out of the optical fiber 24 from the optical demultiplexer 14.

In particular, the demultiplexed optical signal beam 32 which has been guided out of the optical fiber 24 has its optical path changed by the optical path changer 34 of the waveguide 16, and thereafter is transmitted through the waveguide 16. By installing the light-detecting unit on the optical path of the demultiplexed optical signal beam 32 emitted from the waveguide 16, the demultiplexed optical signal beam 32 applied to the light-detecting unit can have its angle of incidence (the angle formed between the line normal to the light-detecting surface and the applied beam) reduced for better light-detecting characteristics.

With the filter 18 being in the form of a BPF, the filter 18 can provide better characteristics (a desired attenuating level in the cut-off range) if the angle of incidence of the beam on the filter 18 is smaller. If the angle of incidence of the beam on the filter 18 is simply to be reduced, then the optical path changer for reducing the angle of incidence needs to be provided between the optical demultiplexer 14 and the light-detecting unit, and the filter 18 needs to be provided between the optical path changer and the light-detecting unit. Therefore, the optical path from the optical demultiplexer 14 to the light-detecting unit has an increased optical path length tending to increase the loss.

In the optical device 10A according to the first embodiment, however, a medium from which the beam is emitted to the optical path changer 34 comprises the waveguide 16, and the filter 18 is disposed on the waveguide 16. Consequently, the angle of incidence of the beam on the filter 18 is reduced, and the length of the optical path from the optical demultiplexer 14 to the light-detecting unit is prevented from being increased. Furthermore, the medium from which the beam is emitted to the optical path changer 34 and the medium from which the beam is applied to the filter 18 are identical to each other (the waveguide 16). Therefore, the medium is optically uniform for better and stable characteristics.

As described above, the optical demultiplexing member 30 comprises a wavelength demultiplexing filter and the filter 18 comprises a BPF. Therefore, the attenuating level in the cut-off range may be of about 40 dB, for example, providing increased isolation between the pass range and the cut-off range.

Because the waveguide 16 is disposed directly above the optical fiber 24, the length of the optical path of the demultiplexed optical signal beam 32 is reduced, and the thickness of the adhesive 36 disposed between the optical fiber 24 and the waveguide 16 is also reduced. The optically unstable region (adhesive layer) is thus reduced for increased optical uniformity of the optical path of the demultiplexed optical signal beam 32.

An optical device 10B according to a second embodiment of the present invention will be described below with reference to FIG. 3.

Figure 3:
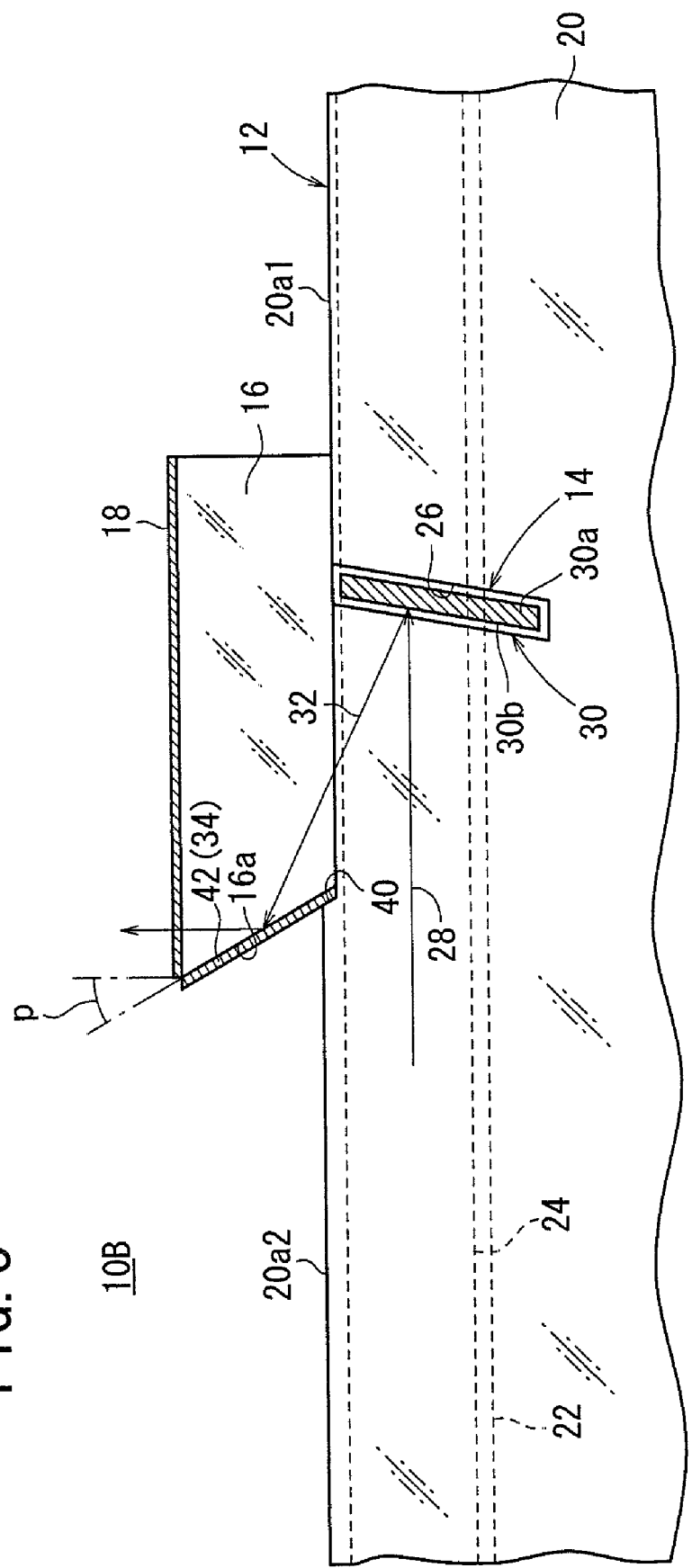
FIG. 3 is a cross-sectional view of an optical device according to a second embodiment of the present invention.

As shown in FIG. 3, the optical device 10B according to the second embodiment differs in that it has a step 40 on the upper surface of the glass substrate 20, the waveguide 16 disposed on a lower surface 20a1 on one side of the step 40 above the optical demultiplexer 14 of the optical fiber 24, and a totally reflecting film 42 (totally reflecting mirror) disposed on an end face 16a of the waveguide 16 (an end face positioned on the optical path of the demultiplexed optical signal beam 32). The filter 18 (e.g., BPF) is formed on the surface of the waveguide 16.

The end face 16a of the waveguide 16 is a tapered surface inclined at such an angle p that the demultiplexed optical signal beam 32 is reflected by the totally reflecting film 42 and emitted along the perpendicular line. Therefore, the totally reflecting film 42 functions as an optical path changer 34 for changing the optical path of the demultiplexed optical signal beam 32.

The step 40 on the glass substrate 20 is also a tapered surface inclined at an angle which is substantially the same as the angle p of inclination of the end face 16a of the waveguide 16.

According to the second embodiment, the waveguide 16 serves as a medium from which the beam is emitted to the optical path changer 34 (the totally reflecting film 42) and to which the beam is emitted from the optical path changer 34. Therefore, not only the beam is emitted (reflected) to the optical path changer 34 and applied to the filter 18, but also the beam is applied to the optical path changer 34, through the same medium (the waveguide 16). The refractive index of the waveguide 16 is substantially the same as the refractive index of the cladding layer of the optical fiber 24 and the refractive index of the adhesive 36 (see FIG. 2, for example) applied between the optical fiber 24 and the waveguide 16. The waveguide 16 may be made of quartz glass as with the cladding of the optical fiber 24.

Operation of the optical device 10B according to the second embodiment will be described below. An optical signal beam component in a particular wavelength range of the optical signal beam 28 transmitted through the optical fiber 24 is demultiplexed by the optical demultiplexer 14, and guided as the demultiplexed optical signal beam 32 out of the optical fiber 24. Other optical signal beam components are transmitted as the optical signal beam 28 through the optical fiber 24.

The demultiplexed optical signal beam 32 that is guided out of the optical fiber 24 enters the waveguide 16. The demultiplexed optical signal beam 32 that has entered the waveguide 16 has its optical path substantially unchanged and is applied to and reflected by the totally reflecting film 42, which changes the optical path of the demultiplexed optical signal beam 32. The demultiplexed optical signal beam 32 whose optical path has been changed is propagated in the waveguide 16 along the perpendicular line, and passes through the filter 18 on the surface of the waveguide 16. At this time, since the demultiplexed optical signal beam 32 is attenuated about 40 dB in the cut-off range by the filter 18, the demultiplexed optical signal beam 32 that has passed through the filter 18 is characterized by increased isolation between the pass range and the cut-off range.

The demultiplexed optical signal beam 32 may not necessarily fall on the BPF perpendicularly thereto. If requirements for polarization dependency and signal distortion are high, then the angle of incidence of the demultiplexed optical signal beam 32 should preferably be as small as possible with respect to not only the BPF, but also a light-detecting unit disposed on the waveguide 16.

According to the second embodiment, because the degree of freedom of the optical changing function is increased only by adjusting the angle p of inclination of the end face 16a of the waveguide 16, it is possible to apply the demultiplexed optical signal beam 32 substantially perpendicularly to the BPF and the light-detecting unit.

According to the second embodiment, the totally reflecting film 42 as the optical path changer 34 and the filter 18 as the BPF are disposed on the waveguide 16. Since the optical path changer 34 and the filter 18 can be disposed on one object (the waveguide 16), the number of parts can be reduced, and the cost of parts and the packaging cost can be reduced. In addition, the integral component is expected to be more reliable than components held together by adhesive bonding.

The waveguide 16 cannot be too thick, in order to prevent the length of the optical path from being increased. With the optical path changer 34 being present on the end face 16a, the thickness of the waveguide 16 cannot be greater than necessary to fully reflect the demultiplexed optical signal beam 32. If the optical path changer 34 is not accurately positioned (longitudinally) along the optical axis of the optical fiber, the spot and the optical path changer 34 are positionally misaligned from each other in the vertical direction, tending to cause a loss. According to the second embodiment, it is preferable that the area (the step 40) for positioning the optical path changer 34 (or the waveguide 16) is disposed on the upper surface of the glass substrate 20.

A modification of the optical device 10B according to the second embodiment will be described below with reference to FIG. 4.

Figure 4:
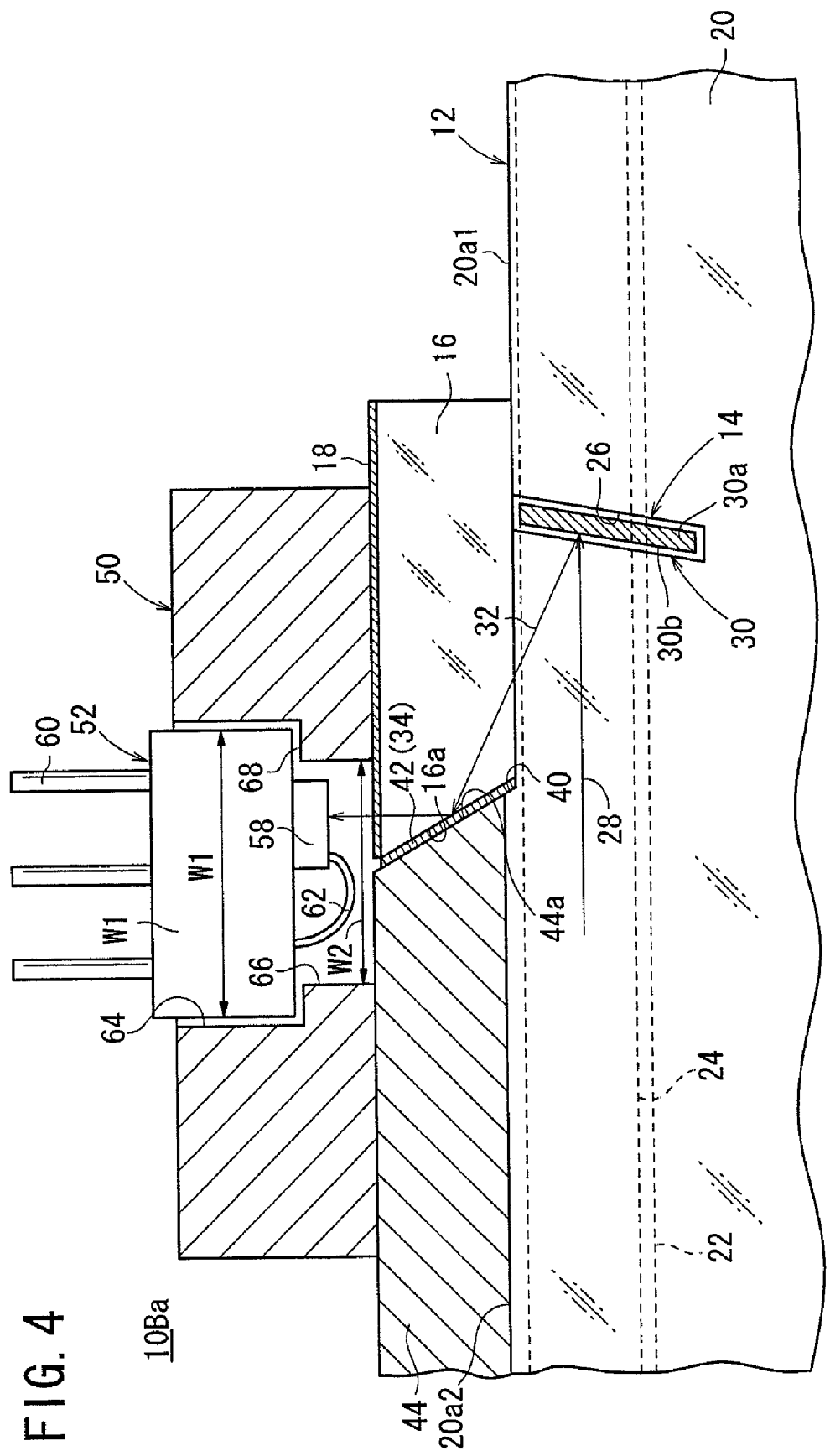
FIG. 4 is a cross-sectional view of a modification of the optical device according to the second embodiment.

As shown in FIG. 4, an optical device 10Ba according to the modification is of essentially the same structure as the optical device 10B according to the second embodiment, except that a guide 44 is disposed on a higher surface 20a2 of the step 40. The angle of inclination of an end face 44a of the guide 44 (an end face confronting the optical path changer 34) is substantially the same as the end face 16a of the waveguide 16, allowing the guide 44 to function as a positioning member for mounting the waveguide 16 and a fixing member for fixing the waveguide 16. The upper surface of the guide 44 and the upper surface of the waveguide 16 (precisely, the upper surface of the filter 18) lie flush with each other to allow the guide 44 to function as a fixing member for fixing a light-detecting unit 50 to be described below as well as the waveguide 16.

The light-detecting unit 50 is a unit disposed on the optical path of the demultiplexed optical signal beam 32 that has passed through the filter 18, and comprises a CAN-type photodiode 52 and a housing 54 housing the photodiode 52 therein.

The photodiode 52 has a base 56 and a chip 58 mounted on the base 56 and having a light-detecting surface. A wiring pattern (not shown) for electrical connection to a plurality of external terminals 60 is disposed on the base 56. The chip 58 is electrically connected to the wiring pattern by bonding wires 62. The housing 54 has a first through hole 64 defined therein which houses the photodiode 52 therein and a second through hole 66 defined therein which communicates with the first through hole 64. The demultiplexed optical signal beam 32 that has passed through the filter 18 passes through the second through hole 66. The second through hole 66 has an opening width W2 smaller than the transverse width W1 of the base 56 of the photodiode 52. The second through hole 66 accommodates therein a light transmission medium which may be an adhesive having a refractive index that is substantially the same as the refractive index of the optical fiber 24 and the waveguide 16. The light transmission medium may alternatively be air.

If the light-detecting unit is disposed over the substrate and has its light-detecting surface positioned on the optical path of the demultiplexed optical signal beam 32 from the optical demultiplexer 14, then the light-detecting unit may be mounted on the optical fiber mount 12 with a spacer interposed therebetween. However, since the optical path changer 34 and the waveguide 16 exist on the optical fiber 24, if such a spacer is employed, then difficulty arises in assembling and manufacturing the optical device, making it costly to manufacture the optical device.

With the first optical device 10Ba, the photodiode 52 is accommodated in the first through hole 64 defined in the housing 54 of the light-detecting unit 50, and the demultiplexed optical signal beam 32 from the optical demultiplexer 14 passes through the second through hole 66 which communicates with the first through hole 64 and has the opening width W2 smaller than the transverse width W1 of the base 56 of the photodiode 52. A step 68 disposed between the first through hole 64 and the second through hole 66 serves as a spacer for the photodiode 52. Since the photodiode 52 can be installed in place simply by placing the housing 54 on the guide 44 and the waveguide 16, the optical device 10Ba can easily be assembled and manufactured at a low cost.

An optical device 10C according to a third embodiment of the present invention will be described below with reference to FIG. 5.

Figure 5:
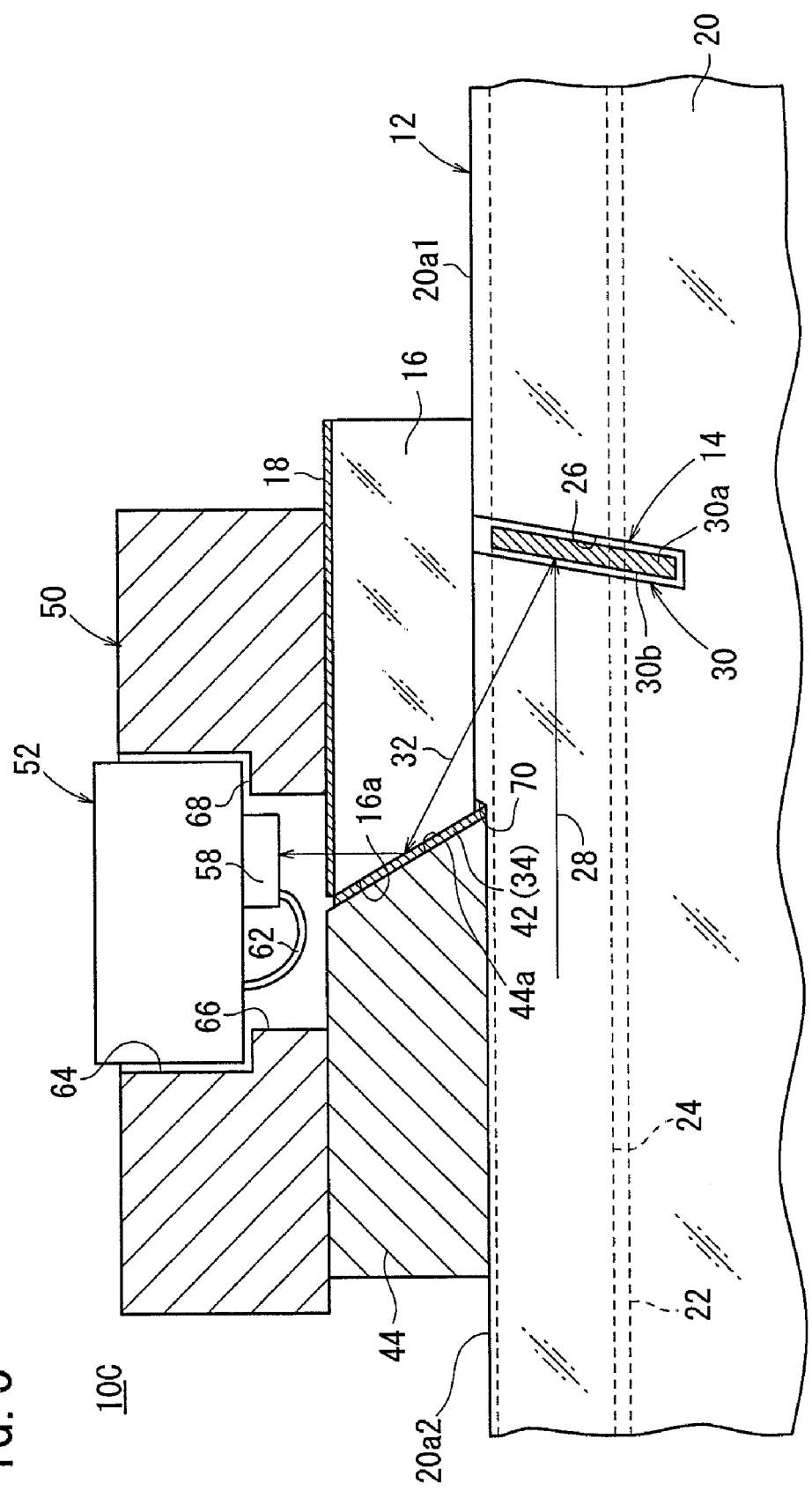
FIG. 5 is a cross-sectional view of an optical device according to a third embodiment of the present invention.

As shown in FIG. 5, the optical device 10C according to the third embodiment is of essentially the same structure as the optical device 10Ba according to the modification of the second embodiment, but differs therefrom in that the upper surface of the glass substrate 20 has a step 70, the waveguide 16 is disposed on the higher surface 20a2 of the step 70 above the optical demultiplexer 14 of the optical fiber 24, the guide 44 is disposed on the lower surface 20a1 of the step 70 in juxtaposed relation to the waveguide 16, and the totally reflecting film 42 (totally reflecting mirror) is disposed on the end face 44a of the guide 44 (an end face confronting the waveguide 16). The guide 44 is arranged such that the totally reflecting film 42 formed on the end face 44a contacts the waveguide 16. That is, the totally reflecting film 42 is sandwiched between the guide 44 and the waveguide 16.

The totally reflecting film 42 which serves as the optical path changer 34 comprises a multilayer film. If a lowermost first layer of the multilayer film of the optical path changer 34 is limited to a certain material due to demand characteristics or the like, and the material (e.g., Au) generally has a weak adhering strength at the time it is formed on the waveguide 16, then it is not preferable to place the optical path changer 34 on the waveguide 16.

According to the third embodiment, however, the optical path changer 34 is disposed on the guide 44 which can be made of a wide selection of materials. Therefore, the above drawback is avoided, and the optical path changer 34 is free of a peel-off problem.

For assembling the optical device 10C, the guide is positioned by the step, and then the waveguide is positioned by the end face of the guide. Therefore, the assembling of the components can passively be completed according to a highly efficient assembling process.

Modifications of the optical device 10C according to the third embodiment will be described below with reference to FIGS. 6 through 11.

Figure 6:
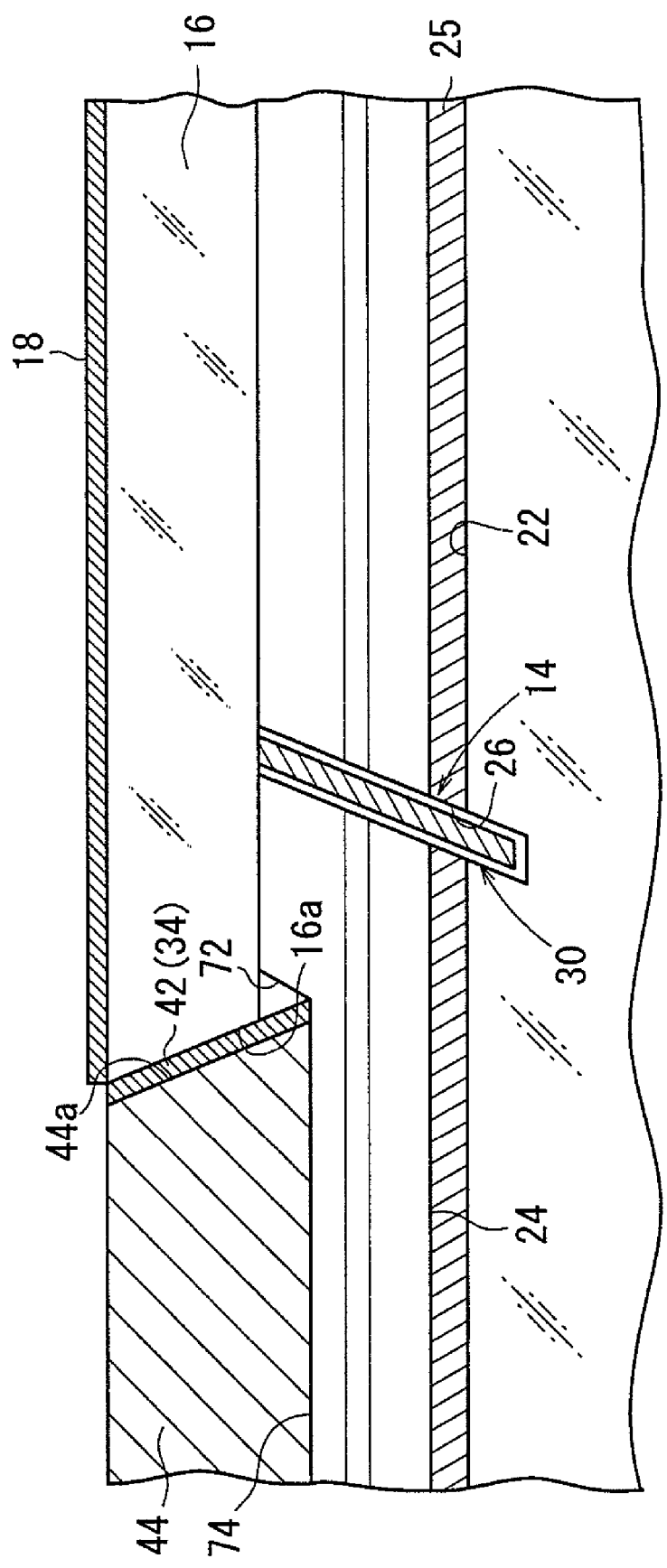
FIG. 6 is a cross-sectional view of a first modification of the optical device according to the third embodiment.

As shown in FIG. 6, an optical device 10Ca according to a first modification is of essentially the same structure as the optical device 10C according to the third embodiment, but differs therefrom a step 72 is formed in the cladding layer of the optical fiber 24, the waveguide 16 is disposed on a higher surface of the step 72, i.e., an upper surface of the predetermined cladding layer of the optical fiber 24, and the guide 44 is disposed on a lower surface 74 of the step 72.

With this arrangement, the optical path changer 34 (the totally reflecting film 42) is positioned closely to the optical demultiplexing member 30 of the optical demultiplexer 14, resulting in a reduced beam diameter (or spot diameter) of the demultiplexed optical signal beam 32 emitted from the waveguide 16. The reduced beam diameter is particularly effective in coupling the demultiplexed optical signal beam 32 to a light-detecting unit having a small light-detecting surface. The light transmission medium on the filter 18 may be an adhesive having a refractive index that is substantially the same as the refractive index of the optical fiber 24 and the waveguide 16. The light transmission medium may alternatively be air.

Figure 7:
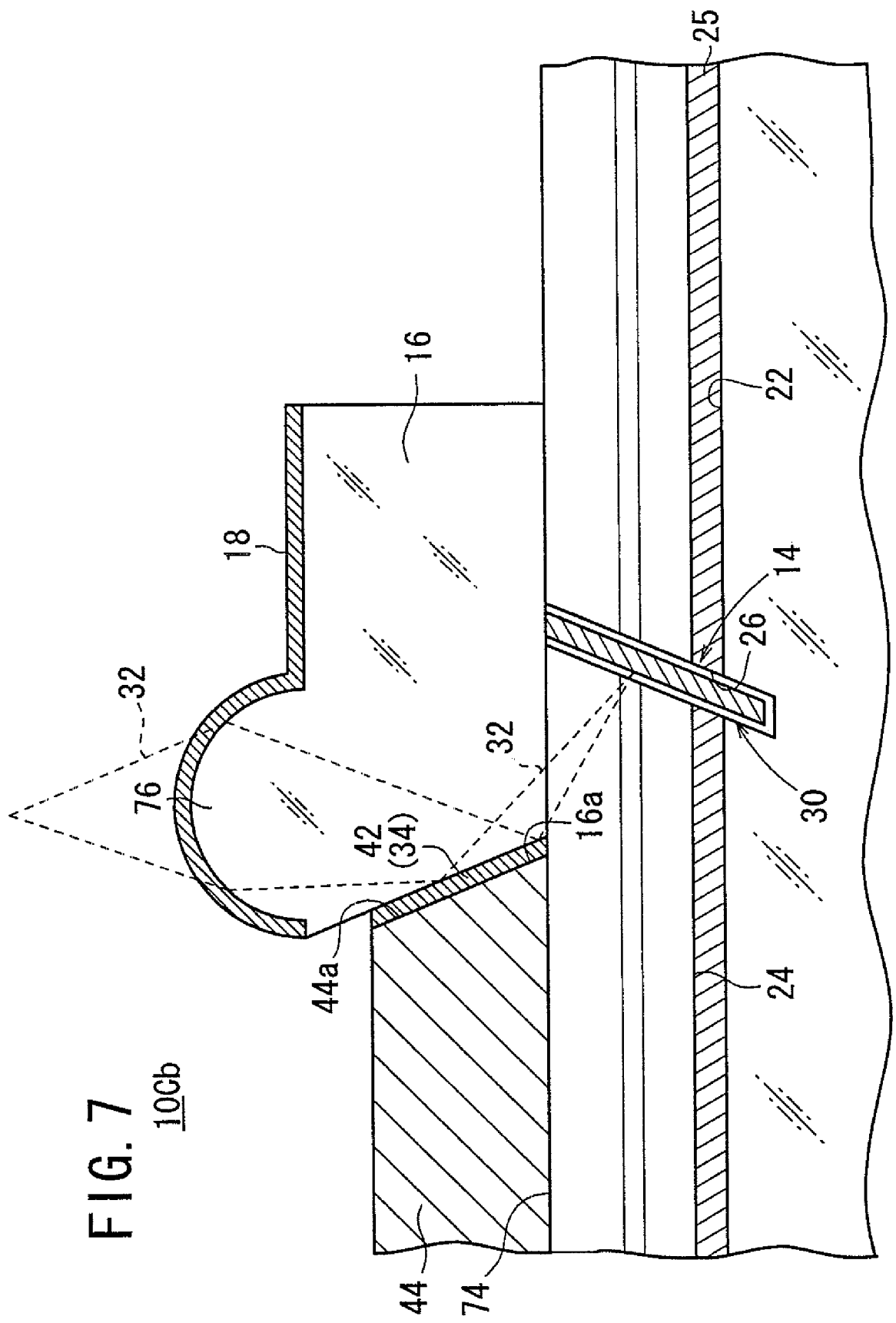
FIG. 7 is a cross-sectional view of a second modification of the optical device according to the third embodiment.

As shown in FIG. 7, an optical device 10Cb according to a second modification is of essentially the same structure as the optical device 10C according to the third embodiment, except that a convex lens 76 may be disposed on an upper surface of the waveguide 16 through which the demultiplexed optical signal beam 32 whose optical path has been changed by the optical path changer 34 passes. The filter 18 is disposed on the upper surface of the waveguide 16 which includes the convex lens 76.

According to the second modification, since the demultiplexed optical signal beam 32 is converged by the convex lens 76, it can be coupled highly efficiently to a light-detecting unit having a small light-detecting surface. If the waveguide 16 is made of glass, then the transmission medium on the emission side over the filter 18 should preferably be a medium such as air or the like which provides a refractive index difference. If the transmission medium on the emission side over the filter 18 is a resin, then the waveguide 16 should preferably be made of a material having a large refractive index such as Si or the like.

Figure 8:
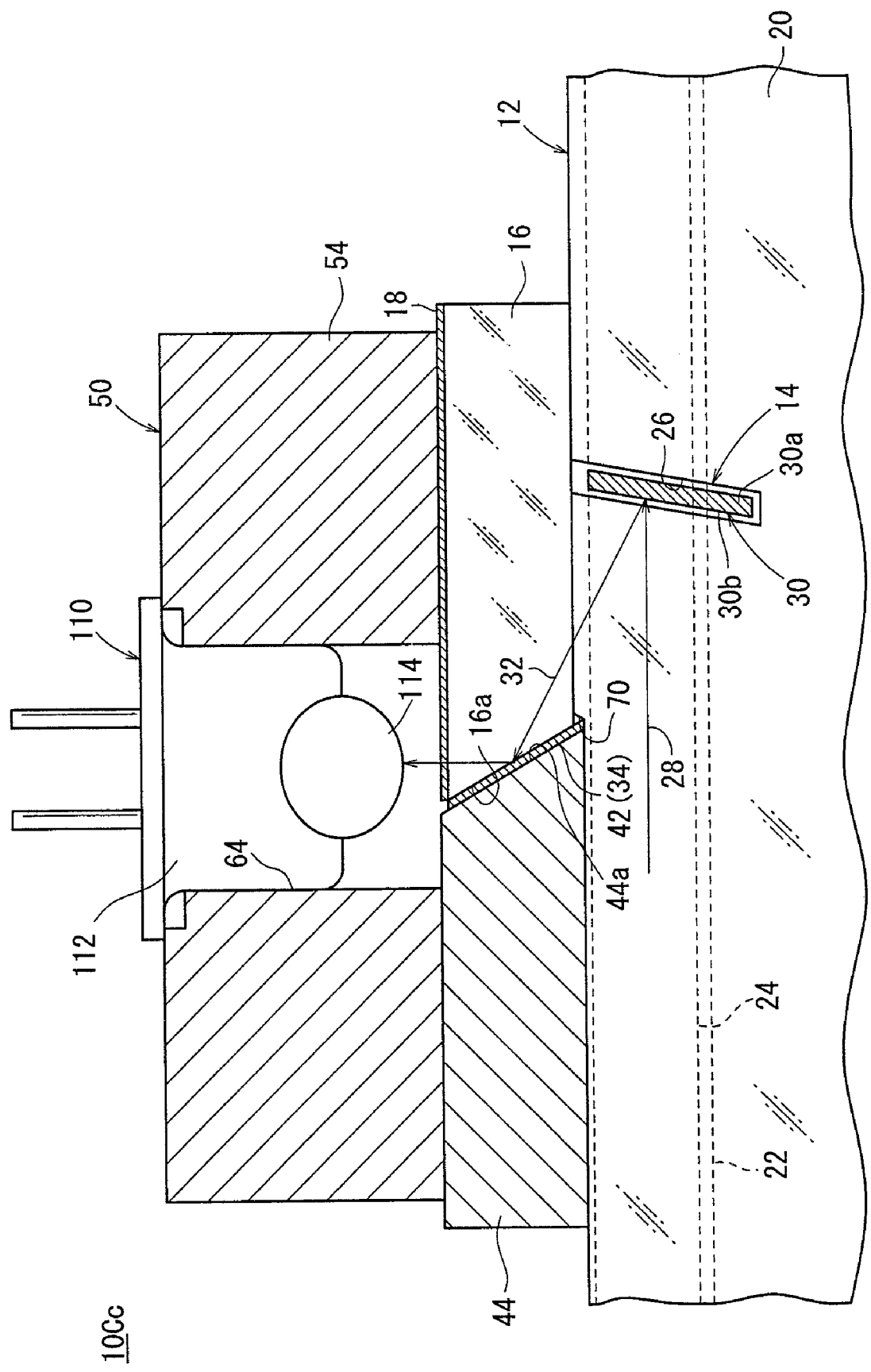
FIG. 8 is a cross-sectional view of a third modification of the optical device according to the third embodiment.

As shown in FIG. 8, an optical device 10Cc according to a third modification differs in that a lens-combined CAN-type photodiode 110 is accommodated in the through hole 64 in the housing 54.

The lens-combined CAN-type photodiode 110 comprises a CAN-type photodiode 112 and a ball lens 114 mounted thereon which has a diameter of 1.5 mm, for example. The lens-combined CAN-type photodiode 110 is accommodated in the through hole 64 such that the ball lens 114 faces the filter 18.

The lens-combined CAN-type photodiode 110 allows the optical device 10Cc to be designed with ease as there is no need to provide a light bending member such as the convex lens 76 in the optical device 10Cb (see FIG. 7) according to the second modification.

Figure 9:
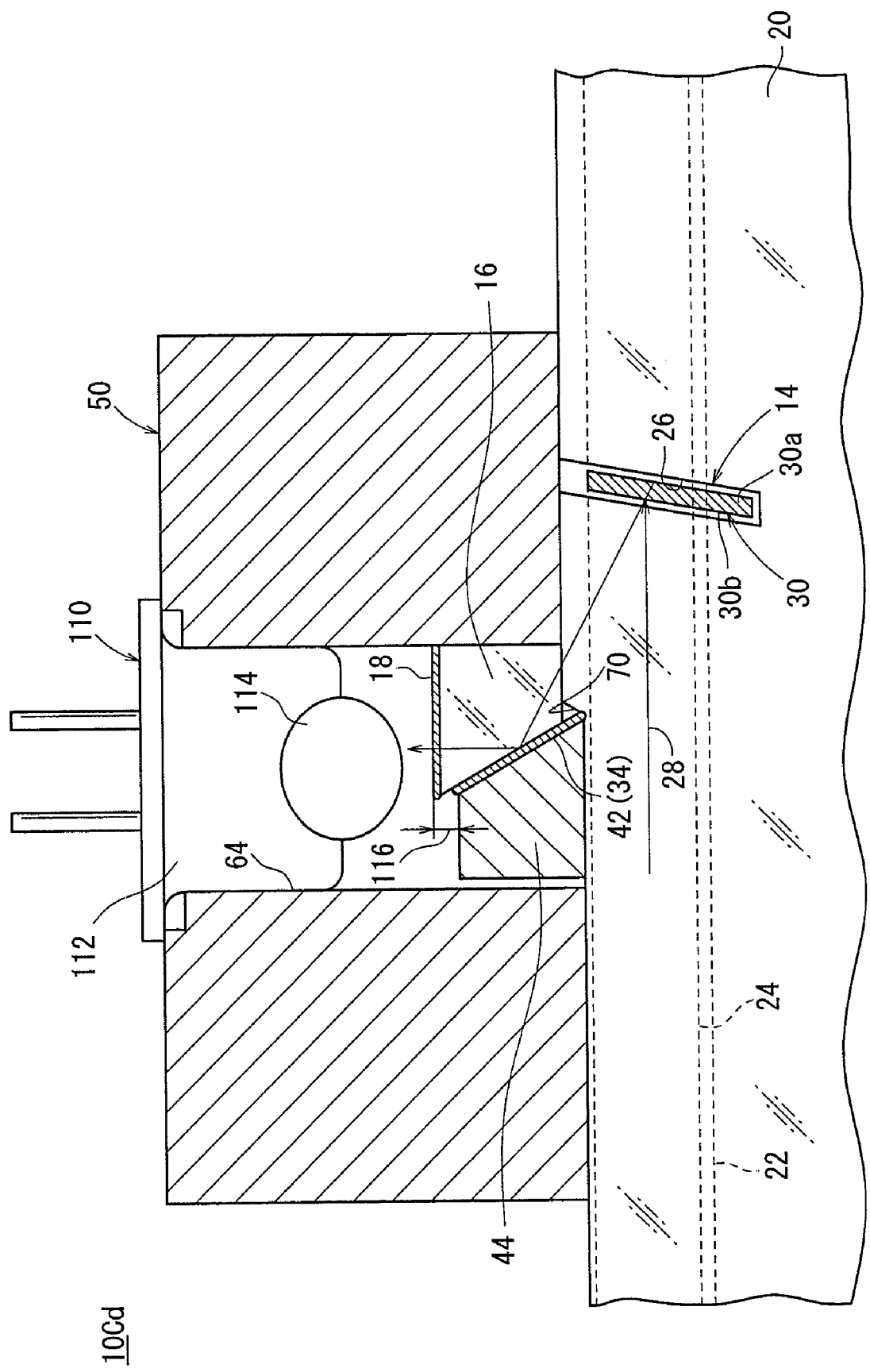
FIG. 9 is a cross-sectional view of a fourth modification of the optical device according to the third embodiment.

As shown in FIG. 9, an optical device 10Cd according to a fourth modification differs from the optical device 10Cc according to the third modification in that the guide 44 with the totally reflecting film 42 disposed thereon and the waveguide 16 with the filter 18 disposed on the upper surface thereof are accommodated in the through hole 64 in the housing 54.

The optical device 10Cb allows the filter 18 (thin film) to be formed in a reduced area for efficiently utilizing the thin film of the filter 18. A step 116 having a dimension ranging from 0.03 mm to 0.15 mm should preferably be disposed between the upper surface of the guide 44 and the upper surface of the waveguide 16. The step 116 is effective to prevent the refractive index matching adhesive from protruding onto the surface of the filter 18 when the guide 44 and the waveguide 16 are installed in place.

Figure 10:
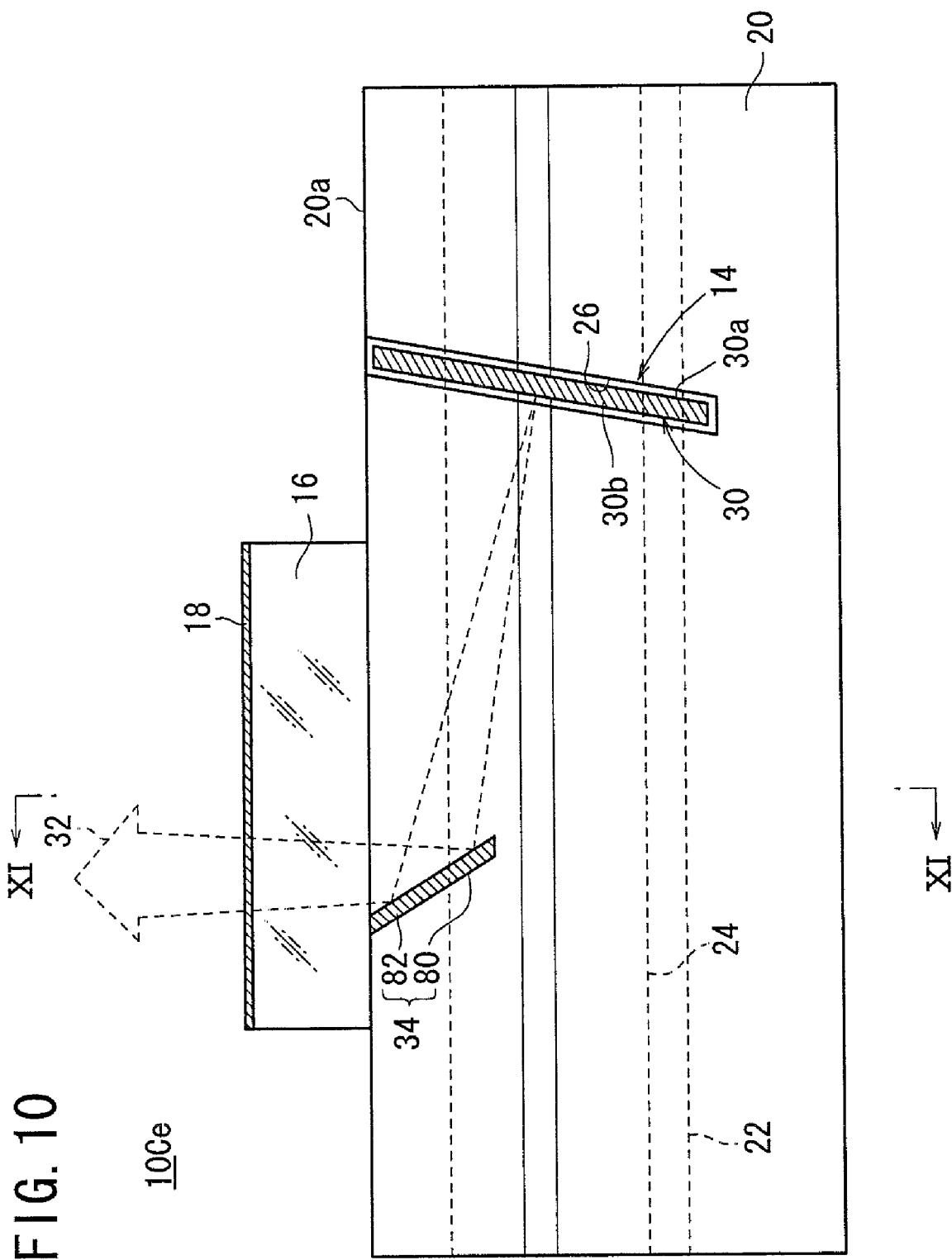
FIG. 10 is a cross-sectional view of a fifth modification of the optical device according to the third embodiment.
Figure 11:
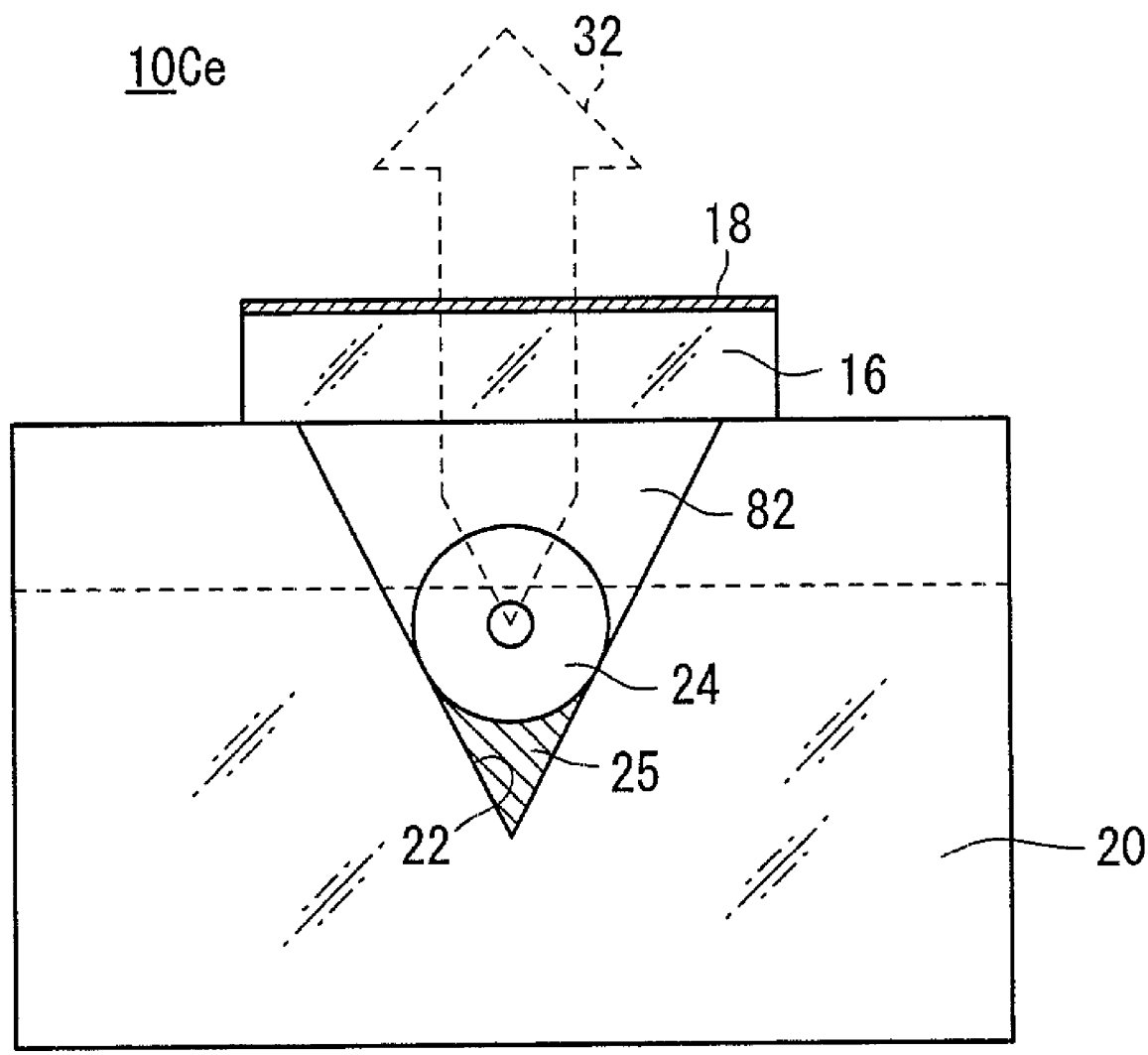
FIG. 11 is a cross-sectional view taken along line XI-XI of FIG. 10.

As shown in FIGS. 10 and 11, an optical device 10Ce according to a fifth modification differs in that in addition to the slit 26 referred to above, a second slit 80 is defined in the glass substrate 20 and extends from the principal surface 20a of the glass substrate 20, but terminates short of the optical axis of the optical fiber 24, and the second slit 80 is filled with a totally reflecting member 82.

The second slit 80 is defined in the cladding layer of the optical fiber 24 on the optical path of the demultiplexed optical signal beam 32 from the optical demultiplexer 14. The second slit 80 has its direction of depth (its angle with respect to the perpendicular line) set to the direction (the angle) in which the demultiplexed optical signal beam 32 is reflected by the totally reflecting member 82 and emitted in the perpendicular line. Therefore, the second slit 80 and the totally reflecting member 82 function as the optical path changer 34 for changing the optical path of the demultiplexed optical signal beam 32.

The waveguide 16 is disposed on the principal surface 20a of the glass substrate 20 on the optical path of the demultiplexed optical signal beam 32 whose optical path has been changed by the optical path changer 34. The filter 18 is formed on the waveguide 16.

According to the fifth modification, the optical path changer 34 can be positioned closely to the optical demultiplexing member 30 of the optical demultiplexer 14, resulting in a reduced beam diameter (or spot diameter) of the demultiplexed optical signal beam 32 emitted from the waveguide 16. Since the components can be machined with ease, the cost of the optical device can be lowered.

An optical device 10D according to a fourth embodiment of the present invention will be described below with reference to FIG. 12.

Figure 12:
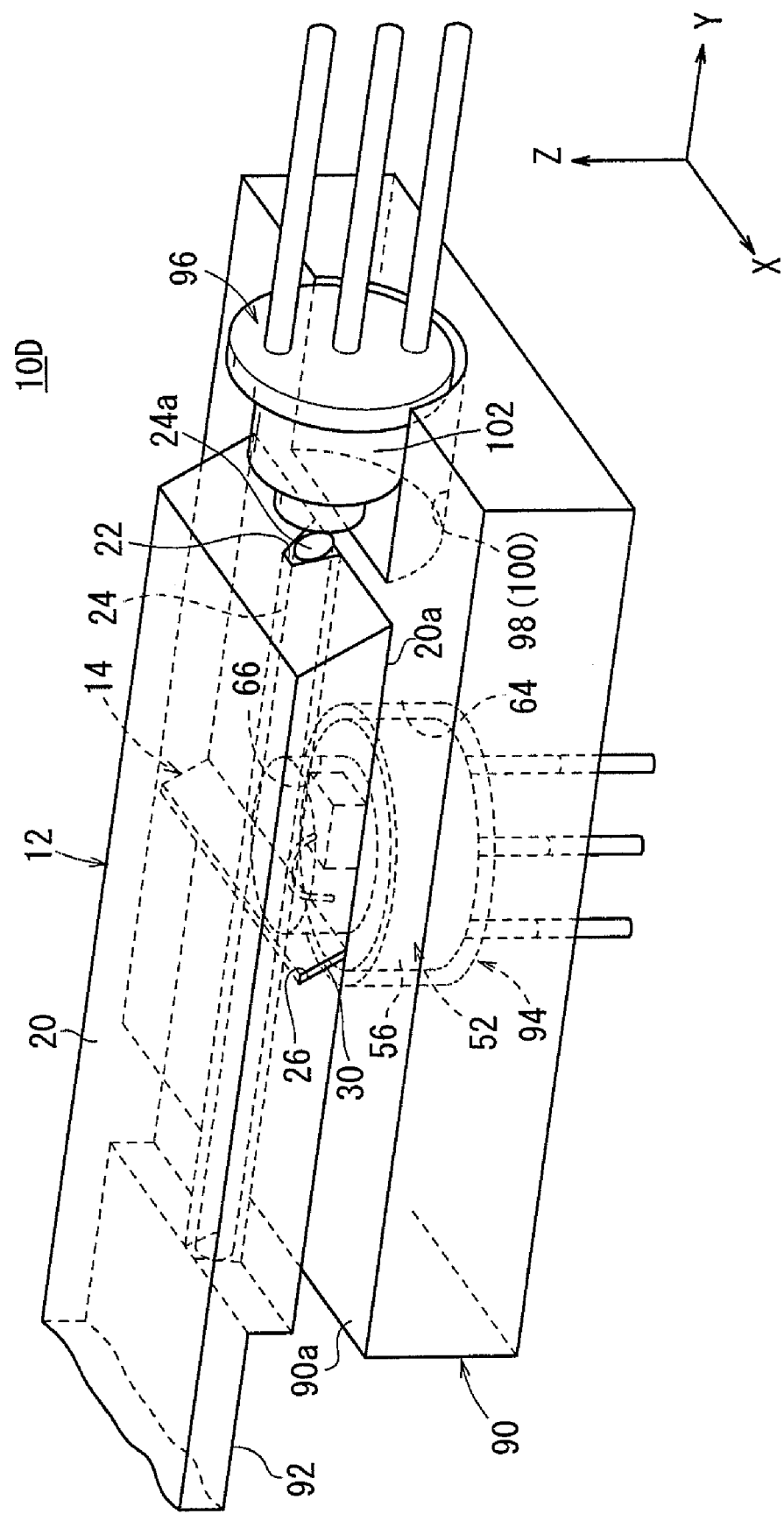
FIG. 12 is a perspective view of an optical device according to a fourth embodiment of the present invention.

As shown in FIG. 12, the optical device 10D according to the fourth embodiment has an optical fiber mount 12, an optical demultiplexer 14, and a holder 90.

The optical fiber mount 12 comprises a glass substrate 20 with at least one fixing groove 22 (a V-shaped groove, a semicircular groove, or the like) defined therein. An optical fiber 24 is fixedly secured in the fixing groove 22. The glass substrate 20 has a fiber covering carriage 92 on which the covering (not shown) of the optical fiber 24 is fixedly placed.

The optical demultiplexer 14 has a slit 26 extending across the optical axis of the optical fiber 24, and an optical demultiplexing member 30 inserted in the slit 26 for demultiplexing a portion of a first optical signal beam transmitted through the optical fiber 24. The demultiplexed optical signal beam from the optical demultiplexing member 30 is guided out of the optical fiber 24.

The slit 26 extends from the principal surface 20a of the glass substrate 20 across the optical axis of the optical fiber 24 and has its lower end positioned below the bottom of the fixing groove 22. The slit 26 has a width ranging from 5 μm to 50 μm as with the first embodiment described above. The depth of the slit 26 is in the range from 130 μm to 250 μm. A refractive index matching agent is placed in the slit 26 between inner wall surfaces of the slit 26 and the optical demultiplexing member 30. In the fourth embodiment, the slit 26 has a width of 30 μm and is inclined by an angle of 20°.

The holder 90 has a PD attachment 94 for attaching a CAN-type photodiode 52 for receiving the demultiplexed optical signal beam from the optical demultiplexer 14 and an LD attachment 98 for attaching a CAN-type laser diode 96 for applying a second optical signal beam to an end face 24a of the optical fiber 24. The holder 90 is fixed to the principal surface 20a of the glass substrate 20 of the optical fiber mount 12, as a fixing surface. Thus, the holder 90 has an upper surface 90a used as a fixing reference for the glass substrate 20. Although not shown, the demultiplexed optical signal beam may be applied to the photodiode 52 through an optical path changer referred to above.

The optical demultiplexer 14 demultiplexes an optical signal beam in a certain wavelength range of the first optical signal beam transmitted through the optical fiber 24. The photodiode 52 detects the optical signal beam in the certain wavelength range from the optical demultiplexer 14. The second optical signal beam emitted from the laser diode 96 is in a wavelength range which is different from the wavelength range of the first optical signal beam. Specifically, the first optical signal beam can be used as a downstream signal in a certain wavelength range, and the second optical signal beam can be used as an upstream signal in another wavelength range.

When the photodiode 52 is mounted on the PD attachment 94, the photodiode 52 has its light-detecting surface positioned on the optical path of the demultiplexed optical signal beam. When the laser diode 96 is mounted on the LD attachment 98, the optical axis of the laser diode 96 and the optical axis of the optical fiber 24 are optically coupled to each other.

Specifically, the PD attachment 94 has a first through hole 64 accommodating the photodiode 52 therein and a second through hole 66 communicating with the first through hole 64. The demultiplexed optical signal beam passes through the second through hole 66. The second through hole 66 has an opening width smaller than the transverse width of the base 56 of the photodiode 52. The PD attachment 94 thus functions to position the light-detecting surface of the photodiode 52 on the optical path of the demultiplexed optical signal beam.

The LD attachment 98 has a U groove 100 defined in a portion of the holder 90 which is close to the end face 24a of the optical fiber 24. The U groove 100 is of a size sufficiently large to allow a portion of a casing 102 of the laser diode 96 to be fitted therein. The U groove 100 has a depth set such that when the portion of the casing 102 is fitted in the U groove 100, the optical axis of the laser diode 96 is optically coupled to the optical axis of the optical fiber 24. Therefore, the LD attachment 98 has a function to position the laser diode 96 on the optical axis of the optical fiber 24.

With the photodiode 52 being placed on the optical path changer 34, the optical device 10D according to the fourth embodiment serves as a wavelength-multiplex reception device.

General photodiodes detect an optical signal beam having a diameter of several 10 μm. Therefore, the demultiplexed optical signal beam should preferably be detected directly by a photodiode with no lens combined therewith from the standpoints of the cost, etc. However, such a lens-free design requires strict positional tolerances on the photodiode in the direction of the optical axis compared with a design employing a lens. Particularly, if the optical path from the optical demultiplexing member 30 is increased due to an optical path change, then there is no margin and the photodiode needs to be positioned accurately in particular.

According to the fourth embodiment, the photodiode 52 is mounted on the PD attachment 94 of the holder 90 which has a positioning function for positioning the photodiode 52, and the upper surface 90a of the holder 90 is fixed in place with respect to a reference surface provided by the principal surface 20a of the glass substrate 20. Therefore, the light-detecting surface of the photodiode 52 can be positioned on the optical path of the demultiplexed optical signal beam.

According to the fourth embodiment, the optical device serves as a transmission/reception device with the laser diode 96 mounted in facing relation to the end face 24a of the optical fiber 24. In the holder 90, inasmuch as the laser diode 96 is mounted on the LD attachment 98 which has a positioning function for positioning the laser diode 96, and the upper surface 90a of the holder 90 is fixed in place with respect to a reference surface provided by the principal surface 20a of the glass substrate 20, the optical axis of the laser diode 96 and the optical axis of the optical fiber 24 can optically be coupled to each other.

An axis (Z-axis) perpendicular to the upper surface 90a of the holder 90 represents a direction in which the photodiode 52 and the optical fiber 24 are spaced closely to or away from each other, but represents a shearing direction with respect to the optical axis of the optical fiber 24 as viewed from the laser diode 96. The laser diode 96 is required to have a much higher level of accuracy than the photodiode 52, in terms of submicrons. The photodiode 52 is also required have a level of accuracy in terms of submicrons as to its axial (X-axis) position which is in a shearing direction with respect to the optical axis of the optical fiber 24. The optical fiber 24 also needs to be positioned with a level of accuracy in terms of submicrons in the axial (Y-axis) direction of the optical fiber 24.

These positioning accuracies can be achieved passively by the positioning function of the holder 90 at the sacrifice of the cost. Consequently, the positioning function of the holder 90 should preferably be used as a provisional positioning function, and the laser diode, the photodiode, and the optical fiber should preferably be fixed in place finally through active alignment (fine adjustment).

For fine adjustment, since the laser diode chip is exposed, the freedom with which to hold and secure the bare-type laser diode is low. Accordingly, fine adjustment can be performed in a very narrow range. A greater fine adjustment range can be provided, often preferably, by installing the CAN-type laser diode 96 on the LD attachment 98 of the holder 90. In recent years, laser diode modules (LD modules) have been available at lower costs, and inexpensive lens-combined LD modules have also been available. It is therefore preferable in some cases to install the CAN-type laser diode 96 on the holder 90.

Because of strict tolerances for the positioning of the laser diode 96, it is necessary that the laser diode 96 be positioned firmly when installed and for a long time. To meet these requirements, the CAN-type laser diode 96 should preferably be welded to the holder 90. Since the welding makes it possible to secure them in a short time, the danger of positional shifts after the laser diode 96 is aligned until it is secured is reduced. Furthermore, because the laser diode 96 and the holder 90 are rigidly secured to each other, long-term reliability is achieved. The gap in regions other than the welded connection between the CAN-type laser diode 96 and the holder 90 should preferably be filled with an adhesive for reinforcement. The welding should preferably be performed by a YAG spot welding process.

The end face 24a of the optical fiber 24 may be a tapered surface for preventing the beam applied from the laser diode 96 from being reflected back to the laser diode 96, i.e., a tapered surface that is inclined a certain angle to the perpendicular line. An AR coating may be applied to the end face 24a of the optical fiber 24 for preventing reflections.

Figure 13:
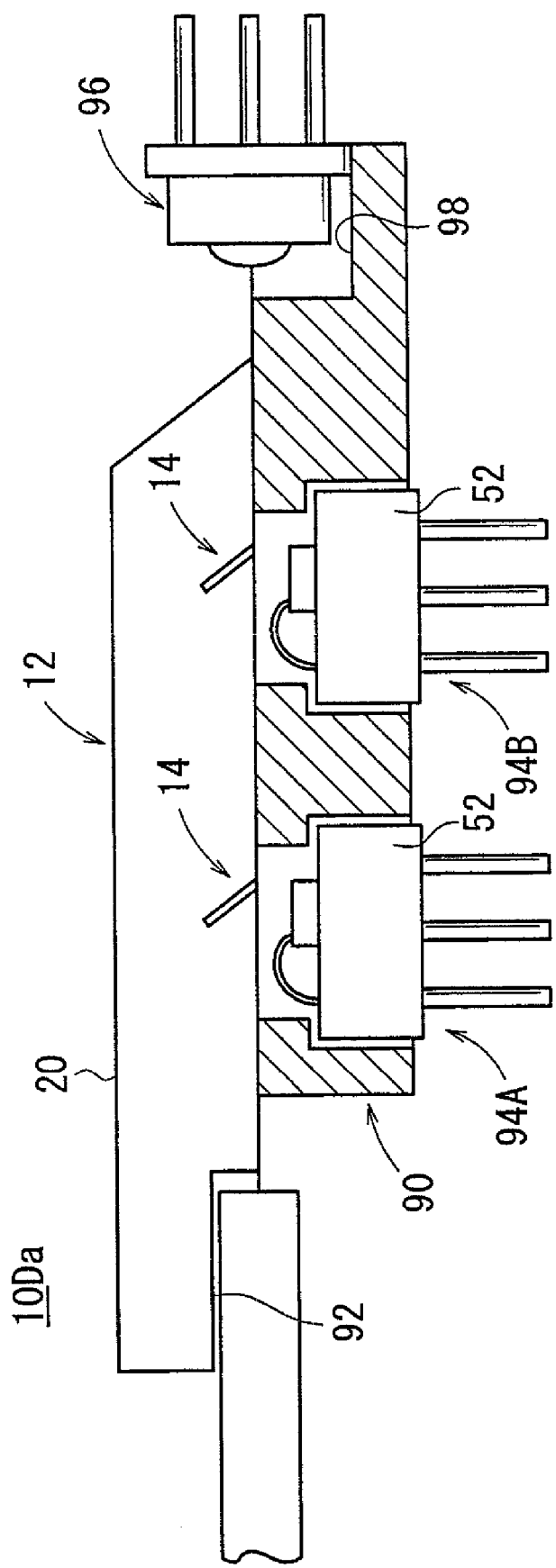
FIG. 13 is a cross-sectional view of a modification of the optical device according to the fourth embodiment.

The optical device described above is applied to a wavelength-multiplex design wherein an upstream signal is in one wavelength range and a downstream signal is in one wavelength range. FIG. 13 shows an optical device 10Da according to a modification in which the holder 90 has two PD attachments 94A, 94B juxtaposed along the optical axis of the optical fiber 24, thereby providing a wavelength-multiplex design wherein an upstream signal is in one wavelength range and a downstream signal is in two wavelength ranges. An optical device may have three or more PD attachments.

In the embodiment shown in FIG. 12, the PD attachment 94 and the LD attachment 98 are provided on the holder 90. Alternatively, only the PD attachment 94 or only the LD attachment 98 may be provided on the holder 90.

In the optical devices 10A through 10D according to the first through fourth embodiments, one optical fiber 24 is mounted in the glass substrate 20. However, the present invention is easily applicable to an optical device wherein a plurality of optical fibers are installed.

EXAMPLE

A single-mode transmission/reception device 200 having a reception wavelength of 1.49 μm and a transmission wavelength of 1.31 μm was fabricated. A process of fabricating the transmission/reception device will be described below with reference to FIGS. 5, 12, 14 through 16.

(1) Fabrication of the Optical Fiber Mount 12

The fiber covering carriage 92 and the fixing groove 22 (see FIG. 5), and the positioning step 70 (see FIG. 5) for the optical path changer were formed on the glass (Pyrex) substrate 20. Thereafter, the single-mode optical fiber 24 was placed in the fixing groove 22, and secured in place by an adhesive. The end face 24a (see FIG. 12) of the optical fiber 24 was optically polished to an inclination angle of 8° for preventing light from the laser diode 96 from being reflected, producing the optical fiber mount 12.

The slit 26 extending from the principal surface 20a of the glass substrate 20 across the optical axis of the optical fiber 24 and having its lower end positioned below the bottom of the fixing groove 22 was formed at an inclination angle of 12° and with a width of 30 μm. The inclination angle should be smaller for sufficiently demultiplexing the received wavelength of 1.49 μm and should be greater for preventing the optical path to the photodiode 52 from being increased in length. The inclination angle was designed appropriately in view of these considerations.

A multilayer film for use as a WDM filter was formed on a wafer of quartz. The multilayer film was designed to reflect and demultiplex a light beam of 1.49 μm applied at an incident angle of 12° and to pass a light beam of 1.31 μm therethrough. After the wafer was processed into a chip, the reverse side of the WDM filter was polished to provide an optical demultiplexing member 30 having a total thickness of 25 μm including the multilayer film.

The optical demultiplexing member 30 was inserted into the slit 26 and secured therein by an adhesive. Thereafter, a totally reflecting film 42 (optical path changer 34) having a surface of Au was evaporated on the wafer surface of glass (Pyrex). The wafer was cut to provide an end face having an inclination angle of 33°, and then processed into a chip to fabricate a guide 44 (see FIG. 5).

A filter 18 (BPF) for passing a band width representing a wavelength λ: 1490±5 nm was formed on the surface of a wafer of quartz which was to serve as a waveguide 16. The wafer was cut to provide a side surface at 33°, and processed into a chip to produce a waveguide 16.

As shown in FIG. 5, the guide 44 was placed on the lower surface 20a2 of the glass substrate 20 of the step 70, and the optical path changer 34 was erected so as to face the optical multiplexing member 30. The optical path changer 34 was positioned in the longitudinal direction with respect to the positioning step 70 for the optical path changer 34, and secured in place by an adhesive.

The waveguide 16 was placed on the higher surface 20a1 of the glass substrate 20 of the step 70, with the filter 18 being positioned on the upper surface and the end face 16a at the angle of 33° being held in intimate contact with the optical path changer 34. The adhesive was applied and hardened so as not to leave gaps between the waveguide 16 and the optical fiber 24 and also between the waveguide 16 and the guide 44.

(2) Fabrication of the Holder 90

Figure 14:
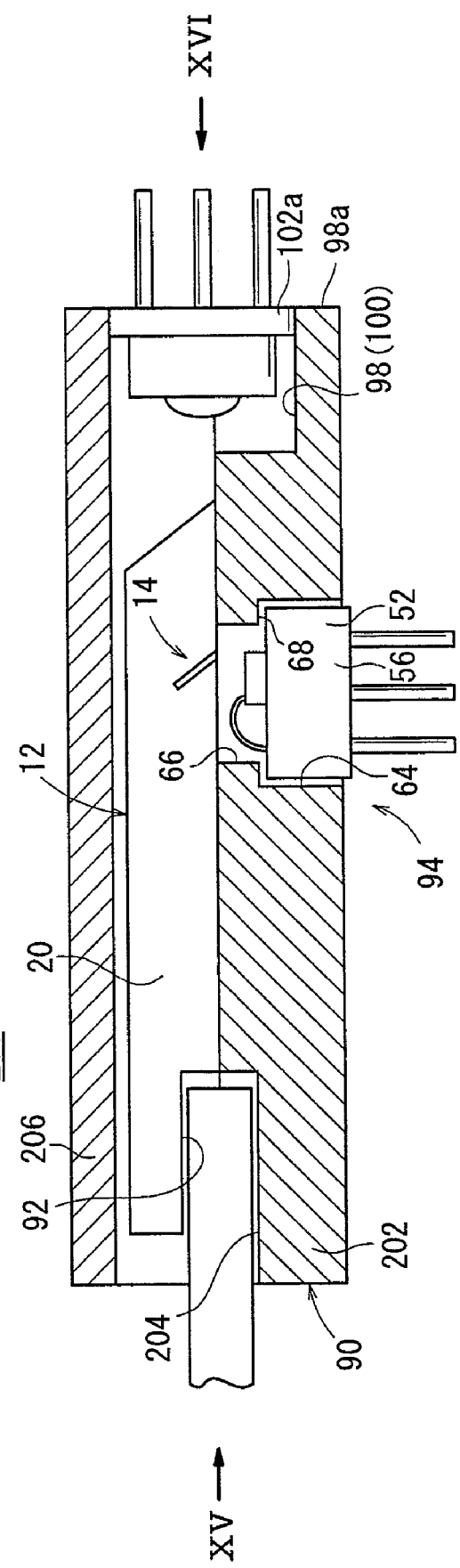
FIG. 14 is a cross-sectional view of a transmitting and receiving system according to an embodiment of the present invention.
Figure 15:
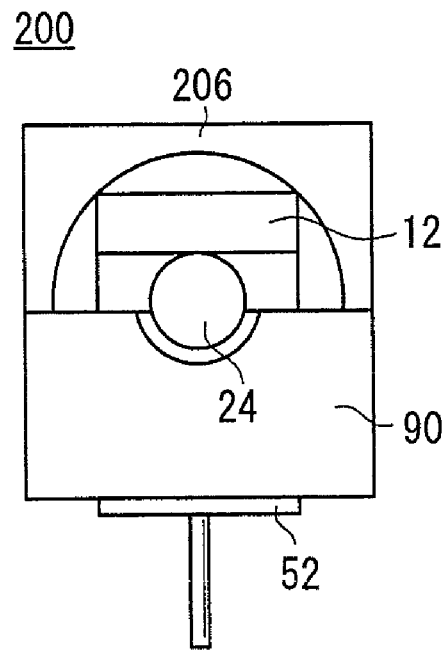
FIG. 15 is a view as viewed along the arrow XV of FIG. 14.
Figure 16:
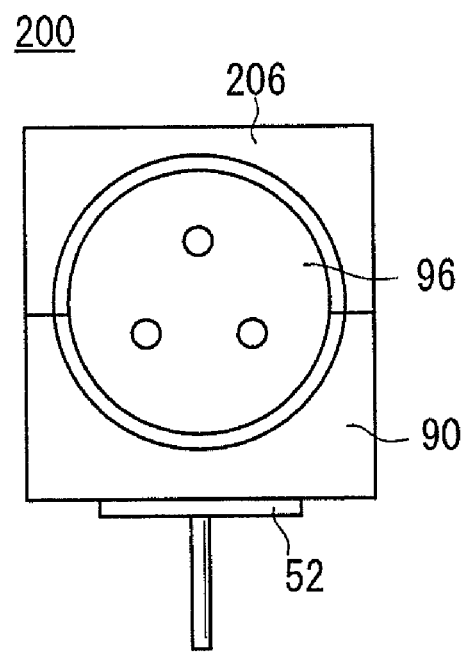
FIG. 16 is a view as viewed along the arrow XVI of FIG. 14.

Then, as shown in FIG. 14, the PD attachment 94 (a countersunk hole: the first through hole 64 and the second through hole 65), the LD attachment 98 (the U groove 100), and a clearance slot 204 (a slot for inserting the fiber covering therein) were machined in a plate 202 of stainless steel.

The CAN-type photodiode 52 was placed in the first through hole 64 of the PD attachment 94, and the base 56 of the photodiode 52 was held against the step 68 between the first through hole 64 and the second through hole 66. An adhesive was applied between the base 56 of the photodiode 52 and the first through hole 64, and hardened to bond them together.

(3) Installation of the Photodiode 52/the Laser Diode 96:

The glass substrate 20 and the holder 90 were held by an alignment device. As shown in FIG. 12, for example, the reference surface (the upper surface 90a) of the holder 90 was held in abutment against the principal surface 20a of the glass substrate 20, and the optical axis of the optical fiber 24 and the central axis of the LD attachment 98 (the U groove 100) were positioned into alignment with each other through image observation.

A laser beam having a wavelength λ=1.49 μm was applied to the opposite end of the optical fiber 24 (the end face opposite to the end face 24*a*, not shown), and the demultiplexed optical signal beam was detected by the photodiode 52. Y-axis adjustment and X-axis fine adjustment were performed to maximize the detected amount of the optical signal beam, and then the glass substrate 20 and the holder 90 were fixed to each other by adhesive bonding. At this time, an adhesive was applied between the filter 18 (BPF) and the photodiode 52 to remove gaps therebetween, and then hardened.

The CAN-type laser diode 96 was mounted on the LD attachment 98 (the U groove 100) of the holder 90. They were substantially aligned in position in the X-axis direction, the Y-axis direction, the rotational direction (θx) about the X-axis, and the rotational direction (θz) about the Z-axis. When the laser diode 96 is energized, light could easily be detected from the opposite end of the optical fiber 24. The CAN-type laser diode 96 was slid on the LD attachment 98 to make adjustment in the Y-axis direction for maximizing the detected amount of light. Thereafter, the CAN-type laser diode 96 was lifted from the LD attachment 98 (the U groove 100) by a range of 3 μm or less. The axes were optimized into a position where the amount of light is maximum. Then, a flange 102*a* of the casing 102 of the CAN-type laser diode 96 and an end face 98*a* of the LD attachment 98 of the holder 90 were provisionally secured to each other by YAG spot welding.

The LD attachment 98 was filled with an adhesive to fix the laser diode 96 and the holder 90 to each other by adhesive bonding. Finally, a concave lid 206 for covering the glass substrate 20 was placed on the upper surface of the holder 90 and secured in place, thereby packing the components.

The optical device according to the present invention is not limited to the above embodiments, but may take various arrangements without departing from the scope of the invention.

What is claimed is:

1. An optical device comprising:
    an optical fiber mount with an optical fiber disposed thereon; and
    an optical demultiplexer having a slit defined in said optical fiber across an optical axis thereof, and an optical demultiplexing member inserted in the slit for demultiplexing a portion of an optical signal beam transmitted through said optical fiber, wherein said optical demultiplexer guides a demultiplexed optical signal beam from said optical demultiplexing member out of said optical fiber;
    an optical path changer for changing an optical path of said demultiplexed optical signal beam guided out of said optical fiber;
    a waveguide serving as at least a medium to which said demultiplexed optical signal beam is emitted from said optical path changer;
    a filter disposed on a surface of said waveguide; and
    a positioning portion disposed on said optical fiber mount to align said optical path changer and said waveguide longitudinally along said optical axis of said optical fiber.

2. An optical device according to claim 1, wherein said waveguide serves as a medium from which said demultiplexed optical signal beam is emitted to said optical path changer and to which said demultiplexed optical signal beam is emitted from said optical path changer.

3. An optical device according to claim 1, wherein said optical demultiplexing member comprises a wavelength demultiplexing filter, and said filter comprises a bandpass filter for passing a light beam in a particular wavelength range of said demultiplexed optical signal beam.

4. An optical device according to claim 1, wherein said waveguide is disposed directly above said optical fiber.

5. An optical device according to claim 1, wherein said optical path changer comprises a totally reflecting mirror.

6. An optical device according to claim 1, wherein said optical path changer is directly formed on a surface of said waveguide.

7. An optical device according to claim 1, wherein a portion of said waveguide doubles as said optical path changer.

8. An optical device according to claim 1, further comprising:
    a light-detecting device disposed on the optical path of a light beam which has passed through said filter.

9. An optical device according to claim 1, further comprising:
    a light-detecting unit disposed on the optical path of a light beam which has passed through said filter;
    said light-detecting unit comprising a light-detecting device and a housing accommodating said light-detecting device therein;
    said housing having a first through hole in which said light-detecting device is accommodated and a second through hole communicating with said first through hole, wherein a light beam having passed through said filter passes through said second through hole;
    said second through hole having an opening width smaller than a transverse width of said light-detecting device.

10. An optical device according to claim 1, wherein said positioning portion comprises a step portion and a guide portion, and said step portion is formed in an upper surface of said optical fiber mount and aligns said optical path changer and said waveguide longitudinally along said optical axis of said optical fiber.

11. An optical device according to claim 1, wherein said positioning portion comprises a step portion formed in a cladding layer of said optical fiber, wherein said step portion aligns said optical path changer and said waveguide longitudinally along said optical axis of said optical fiber.

* * * * *